(12) United States Patent
Kouyama et al.

(10) Patent No.: US 8,405,513 B2
(45) Date of Patent: Mar. 26, 2013

(54) CONNECTION CONFIRMATION SYSTEM AND MAIN BODY DEVICE

(75) Inventors: Tomoaki Kouyama, Souka (JP); Yasunori Hashizume, Matsusaka (JP); Satoru Goto, Ichikawa (JP)

(73) Assignee: Buffalo Inc., Nagoya-shi (JP)

( * ) Notice: Subject to any disclaimer, the term of this patent is extended or adjusted under 35 U.S.C. 154(b) by 314 days.

(21) Appl. No.: 12/962,057

(22) Filed: Dec. 7, 2010

(65) Prior Publication Data

US 2011/0133943 A1    Jun. 9, 2011

(30) Foreign Application Priority Data

Dec. 7, 2009    (JP) .................................. 2009-278053

(51) Int. Cl.
 *G08B 21/00*    (2006.01)
(52) U.S. Cl. .. 340/635; 340/10.1; 324/133; 324/762.02; 324/754.03
(58) Field of Classification Search .................. 340/635, 340/10.1; 324/133, 754.03, 762.02; 345/161
 See application file for complete search history.

(56) References Cited

U.S. PATENT DOCUMENTS

| | | | | |
|---|---|---|---|---|
| 6,457,071 | B1 * | 9/2002 | Thorland et al. | 710/19 |
| 6,520,809 | B1 * | 2/2003 | Son | 439/679 |
| 7,075,515 | B2 * | 7/2006 | Tsai et al. | 345/161 |
| 2004/0133870 | A1 * | 7/2004 | Liu et al. | 716/17 |
| 2006/0125499 | A1 * | 6/2006 | Shibuya | 324/754 |
| 2009/0018731 | A1 * | 1/2009 | Grenell et al. | 701/51 |
| 2011/0043333 | A1 * | 2/2011 | German | 340/10.1 |

FOREIGN PATENT DOCUMENTS

| | | |
|---|---|---|
| JP | 8-95687 | 4/1996 |
| JP | 11-8030 | 1/1999 |
| JP | 2001-338725 | 12/2001 |
| JP | 2003-288140 | 10/2003 |
| JP | 2006-338189 | 12/2006 |
| JP | 2007-26643 | 2/2007 |
| JP | 2009-116784 | 5/2009 |

OTHER PUBLICATIONS

Office Action issued Nov. 29, 2011 in Japanese Patent Application No. 2009-278053 (with English translation).
U.S. Appl. No. 12/981,919, filed Dec. 30, 2010, Kouyama, et al.

* cited by examiner

*Primary Examiner* — Hoi Lau
(74) *Attorney, Agent, or Firm* — Oblon, Spivak, McClelland, Maier & Neustadt, L.L.P.

(57) ABSTRACT

An electrical connection confirmation system includes a cartridge type HDD 200 and a storage device main body 100 into which the cartridge type HDD 200 is inserted. The cartridge type HDD 200 includes a HDD connector 230 configured to comply with SATA standard, and having pins 210a to 210j and 210l to 210o that are internally shorted. The storage device main body 100 includes a main body connector 130 configured to comply with SATA standard, and having pins 110a to 110j and 110l to 110o provided in positions respectively opposite to the pins 210a to 210j and 210l to 210o. The electrical connection of the cartridge type HDD 200 to the storage device main body 100 is detected based on voltage states or electric current states of the specified pins 110d, 110g, and 110m.

13 Claims, 5 Drawing Sheets

FIG. 5

|  | NOT CONNECTED | CONNECTED |
|---|---|---|
| DETECTION SIGNAL 1 | Any[V] | 0[V] |
| DETECTION SIGNAL 2 | 0[V] | 5[V] |
| DETECTION SIGNAL 3 | 0[V] | 12[V] |

CONNECTION CONFIRMATION SYSTEM AND MAIN BODY DEVICE

CROSS REFERENCE TO RELATED APPLICATION

This application is based upon and claims the benefit of priority from the prior Japanese Patent Application No. 2009-278053 filed on Dec. 7, 2009; the entire contents of which are incorporated herein by reference.

BACKGROUND OF THE INVENTION

1. Field of the Invention

The present invention relates to a connection confirmation system and a main body device which are capable of confirming that an external device is properly connected to the main body device.

2. Description of the Related Art

Conventionally, an electronic device having a configuration in which an external device is inserted in its main body device has been widely used. As an electronic device having such a configuration is known, for example, a storage device into which a removable storage medium is inserted.

The main body device and the external device have their respective connectors, and data transfer via the connectors is made possible by inserting the external device in the main body device and connecting the connectors provided in these electronic devices to each other.

However, even though a user connects one connector to the other, an error occurs in data transfer if the electrical connection between the connectors is insufficient. When the external device is inserted in the main body device, however, it is difficult for the user to visually confirm from outside that there is secure electrical connection between the connectors.

In order to automatically confirm the electrical connection between the connectors, a technique has been proposed in which multiple dedicated pins for electrical connection confirmation are newly added to the connector of the external device to confirm the electrical connection by detecting electric current flowing through the pins (see, Japanese Patent Application Publication No. 2001-338725).

SUMMARY OF THE INVENTION

The shapes of connectors are generally defined by the interface standard. However, in the technique described in Japanese Patent Application Publication No. 2001-338725, dedicated pins for electrical connection confirmation are newly added to the connector. Due to the addition of the dedicated pins, the connector no longer complies with the interface standard, and thus has a problem that the compatibility of the connector cannot be ensured.

Also, the technique described in Japanese Patent Application Publication No. 2001-338725 has another problem that the connector size is increased due to the addition of the dedicated pins for electrical connection confirmation to the connector.

Thus, it is an object of the present invention to provide an electrical connection confirmation system and a main body device which are capable of confirming that secure electrical connection is established between the main body device and an external device.

In order to solve the problems described above, the present invention has the following features.

According to a first feature of the present invention, there is provided an electrical connection confirmation system including an external device (e.g. a cartridge type HDD 200) and a main body device (e.g. a storage device main body 100) into which the external device is inserted, wherein the external device includes an external device connector (e.g. a HDD connector 230) configured to comply with a predetermined interface standard, the external device connector having a plurality of short-circuit pins (e.g. pins 210a to 210j and 210l to 210o) that are internally shorted; and the main body device includes a main body device connector (e.g. a main body connector 130) configured to comply with the predetermined interface standard, the main body device connector having a plurality of opposite pins (e.g. pins 110a to 110j and 110l to 110o) provided in positions respectively opposite to the is plural short-circuit pins; and a connection detector (e.g. a CPU 150) connected to a specific one (e.g. pins 110d, 110g, or 110m) of the plural opposite pins for detecting the electrical connection of the external device connector to the main body device connector based on a voltage state or an electric current state of the specific opposite pin.

According to such a feature, the electrical connection can be confirmed by using some of short-circuit pins internally shorted in the external device connector configured to comply with the interface standard. Accordingly, it is not necessary to newly add dedicated pins for electrical connection confirmation to the connector, and thus the electrical connection between the connectors can be confirmed, while ensuring the compatibility of the connectors and preventing increase of the connector size.

According to a second feature of the present invention, there is provided an electrical connection confirmation system as based on the first feature described above, wherein each of the plural short-circuit pins and the plural opposite pins is any one of a power supply pin used for power supply, a ground pin used for grounding, and a signal pin used for signal input/output.

According to a third feature of the present invention, there is provided an electrical connection confirmation system as based on the first feature described above, wherein at least two of the plural opposite pins serve as the specific opposite pin, and the connection detector detects the electrical connection of the external device connector to the main body device connector based on a combination of voltage states or electric current states of specific opposite pins.

According to a fourth feature of the present invention, there is provided an electrical connection confirmation system as based on the first feature described above, wherein the main body device includes a notification unit (e.g. a CPU 150 and a network interface 170, or LED 180) that performs a process of notification to a user based on whether or not the electrical connection of the external device connector is detected by the connection detector.

According to a fifth feature of the present invention, there is provided an electrical connection confirmation system as based on the first feature described above, wherein the predetermined interface standard is Serial Advanced Technology Attachment (SATA) standard.

According to a sixth feature of the present invention, there is provided an electrical connection confirmation system as based on the first feature described above, wherein the external device is a removable storage medium, and the main body device is a storage device main body that writes data to the storage medium and reads data from the storage medium.

According to a seventh feature of the present invention, there is provided an electrical connection confirmation system as based on the first feature described above, wherein the main body device includes an operation confirmation unit (e.g. a CPU 150 and a SATA controller 140) for confirming that the external device operates normally when the connection detector detects the electrical connection of the external device connector to the main body device connector.

According to an eighth feature of the present invention, there is provided a main body device into which an external device is inserted, the external device including an external device connector configured to comply with a predetermined interface standard, the external device connector having a plurality of short-circuit pins that are internally shorted, the main body is device comprising: a main body device connector configured to comply with the predetermined interface standard, and having a plurality of opposite pins provided in positions respectively opposite to the plural short-circuit pins; and a connection detector connected to a specific one of the plural opposite pins, and configured to detect the electrical connection of the external device connector to the main body device connector based on a voltage state or an electric current state of the specific opposite pin.

BRIEF DESCRIPTION OF THE DRAWINGS

FIG. 5 is a table used for describing the connection detection operations by a CPU according to the embodiment of the present invention.

DESCRIPTION OF THE EMBODIMENTS

Figure 1:
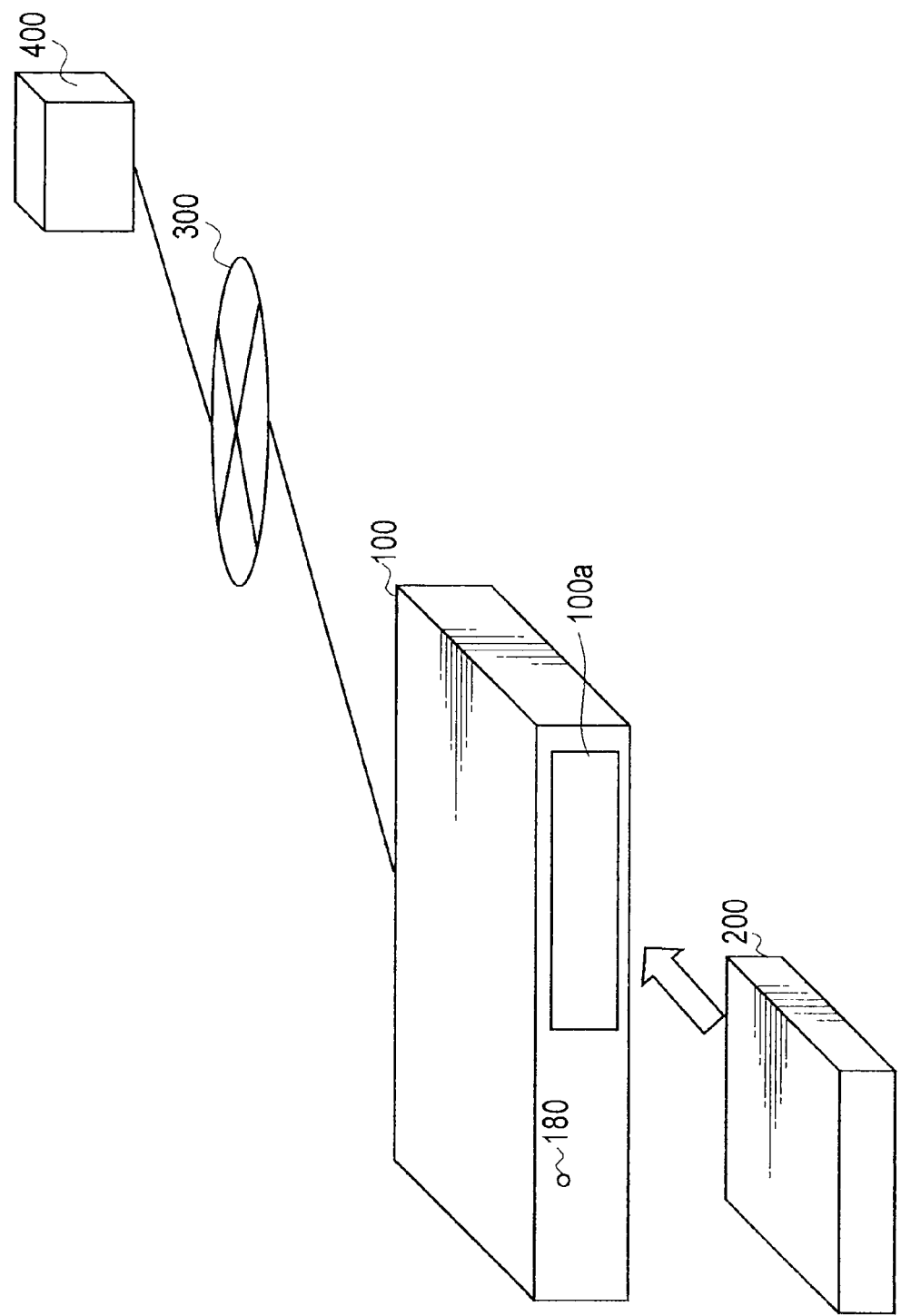
FIG. 1 is an entire schematic configuration diagram including a NAS according to an embodiment of the present invention.

Next, an embodiment of the present invention is described with reference to the drawings. In the drawings, the same or similar components are labeled with the same or similar reference numerals.

It should be noted that the drawings are simplified representations of the accrual constitution, and that dimensions of parts are different from actual ones. Accordingly, actual dimensions should be interpreted according to the following description. Further, it should also be understood that the same part may be different in size in different drawings. In the following, an embodiment where a connection confirmation system of the present invention is applied to a storage device supporting network, i.e. network attached storage (NAS), is described.

A NAS according to the present embodiment has a removable storage medium. A case where a hard disk drive (HDD) using a magnetic disc is utilized as the storage medium is illustrated, but a solid state drive (SSD) using a nonvolatile memory, or an optical drive may be used instead of the HDD.

In the following, (1) Entire Schematic Configuration, (2) Detailed Configuration, (3) Connection Detection Operations, (4) Effects of the Embodiment, and (5) Other Embodiments are described in this order named.

(1) Entire Schematic Configuration

Figure 2:
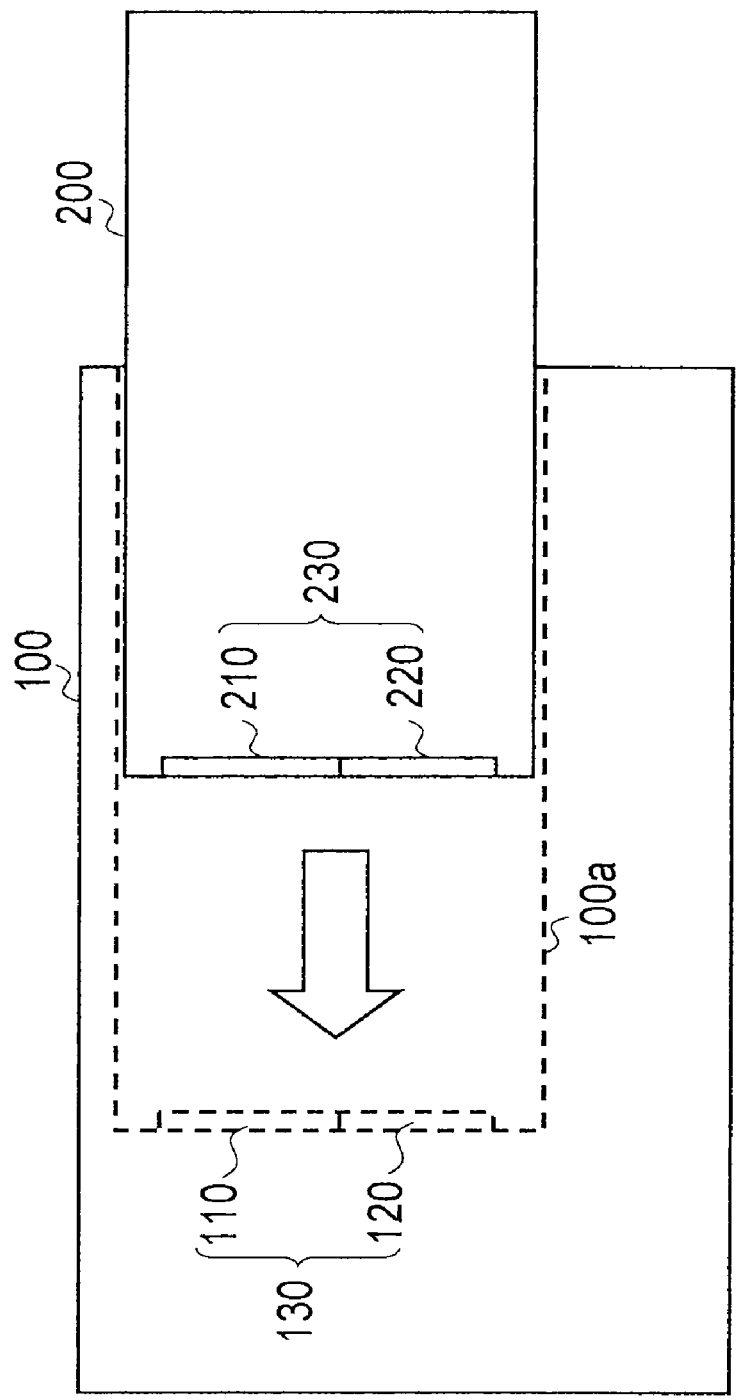
FIG. 2 is a plan view showing a state of a main storage device and a cartridge type HDD when the cartridge type HDD is inserted in the main storage device according to the embodiment of the present invention.

First, referring to FIGS. 1 and 2, the entire schematic configuration of the NAS according to the present embodiment is described.

FIG. 1 is the schematic diagram of the entire configuration including the NAS according to the present embodiment. In the present embodiment, the NAS is configured with a storage device main body 100 as a main body device, and a cartridge type HDD 200 is as an external device.

The storage device main body 100 is connected to a network 300 such as a home network. The storage device main body 100 transmits commands and data to and receives commands and data from, a client terminal 400 such as a PC or a television receiver via the network 300. The storage device main body 100 writes data to and read data from, the cartridge type HDD 200 according to the commands.

The storage device main body 100 has an HDD slot 100a into which the cartridge type HDD 200 is inserted. The cartridge type HDD 200 is an HDD housed in a cartridge, and can be removably set in the storage device main body 100.

For simplification, only one HDD slot 100a is shown provided in the storage device main body 100 in FIG. 1, but plural HDD slots 100a may be provided in the storage device main body 100.

Because the cartridge type HDD 200 can be removably set in the storage device main body 100, the memory capacity can be increased by using another cartridge type HDD 200 of greater memory capacity when the memory capacity of the original cartridge type HDD 200 proved insufficient. Also, different cartridge type HDDs 200 can be used for different attributes of data to be stored.

The storage device main body 100 is provided with a light emitting device (LED) 180. The detail of the LED 180 is described later.

FIG. 2 is a plan view illustrating how the cartridge type HDD 200 is inserted in the storage device main body 100.

As shown in FIG. 2, the HDD slot 100a of the storage device main body 100 is provided with a main body connector 130. The cartridge type HDD 200 is provided with a HDD connector 230. In the present embodiment, the HDD connector 230 corresponds to the external device connector, and the main body connector 130 corresponds to the main body device connector.

Data transfer via the main body connector 130 and the HDD connector 230 becomes possible by inserting the cartridge type HDD 200 in the storage device main body 100 and namely electrically connecting the main body connector 130 and the HDD connector 230 with each other.

In the present embodiment, the main body connector 130 and the HDD connector 230 are configured to comply with one of the interface standards, i.e. Serial Advanced Technology Attachment (SATA) standard. That is, the main body connector 130 and the HDD connector 230 have a connector shape complying with the SATA standard, and new pins are not physically added to the connectors.

In the SATA standard, a power pin group and a signal pin group are separately provided. Specifically, the main body connector 130 has a main body SATA power connector 110 which is a power pin group, and a main body SATA signal connector 120 which is a signal pin group. Similarly, the HDD connector 230 has a HDD SATA power connector 210 which is a power pin group, and a HDD SATA signal connector 220 which is a signal pin group. The main body SATA power connector 110 and the HDD SATA power connector 210 are connected to each other, and the main body SATA signal connector 120 and the HDD SATA signal connector 220 are connected to each other.

(2) Detailed Configuration

Figure 3:
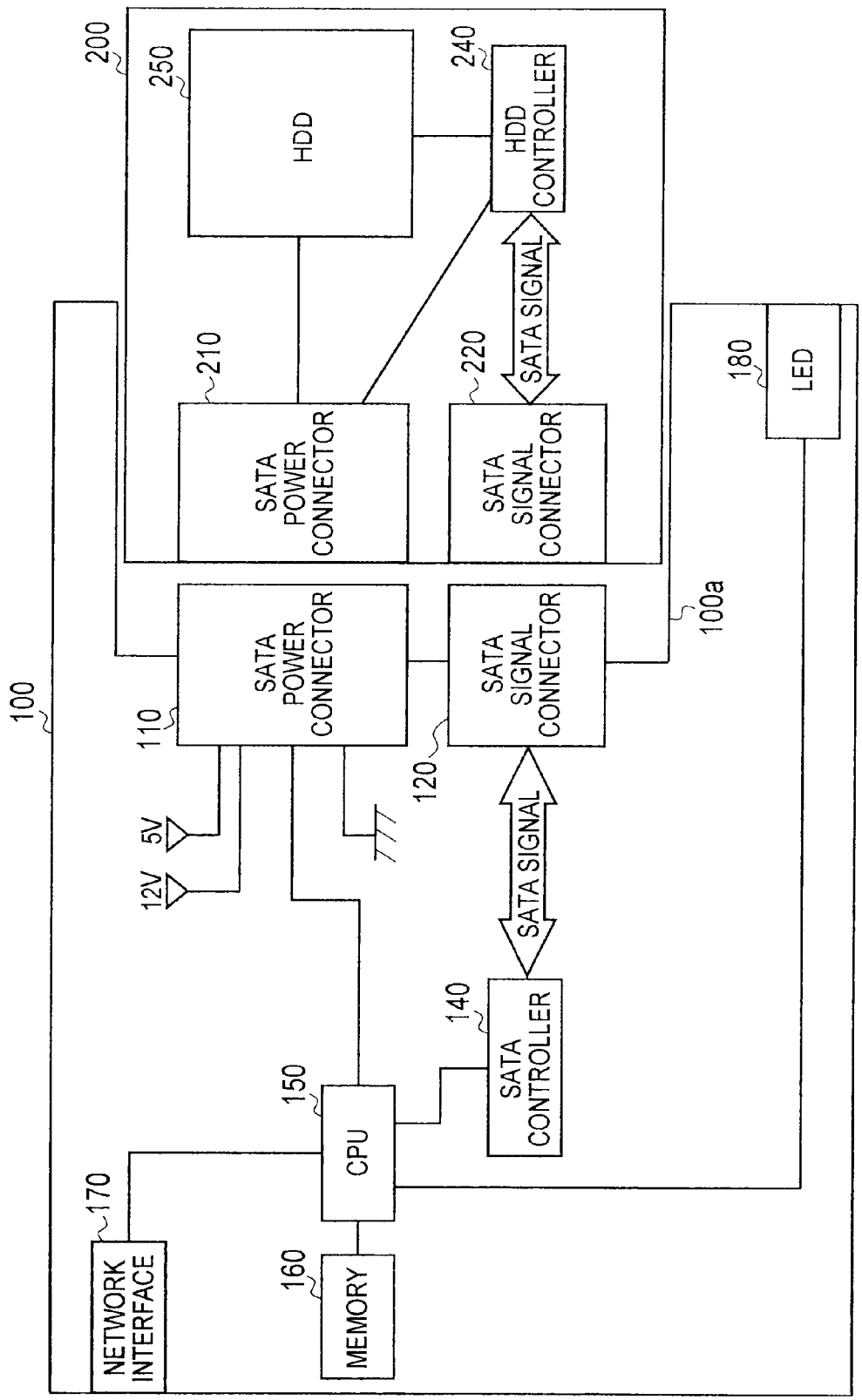
FIG. 3 is a block diagram showing a configuration of the NAS according to the embodiment of the present invention.
Figure 4:
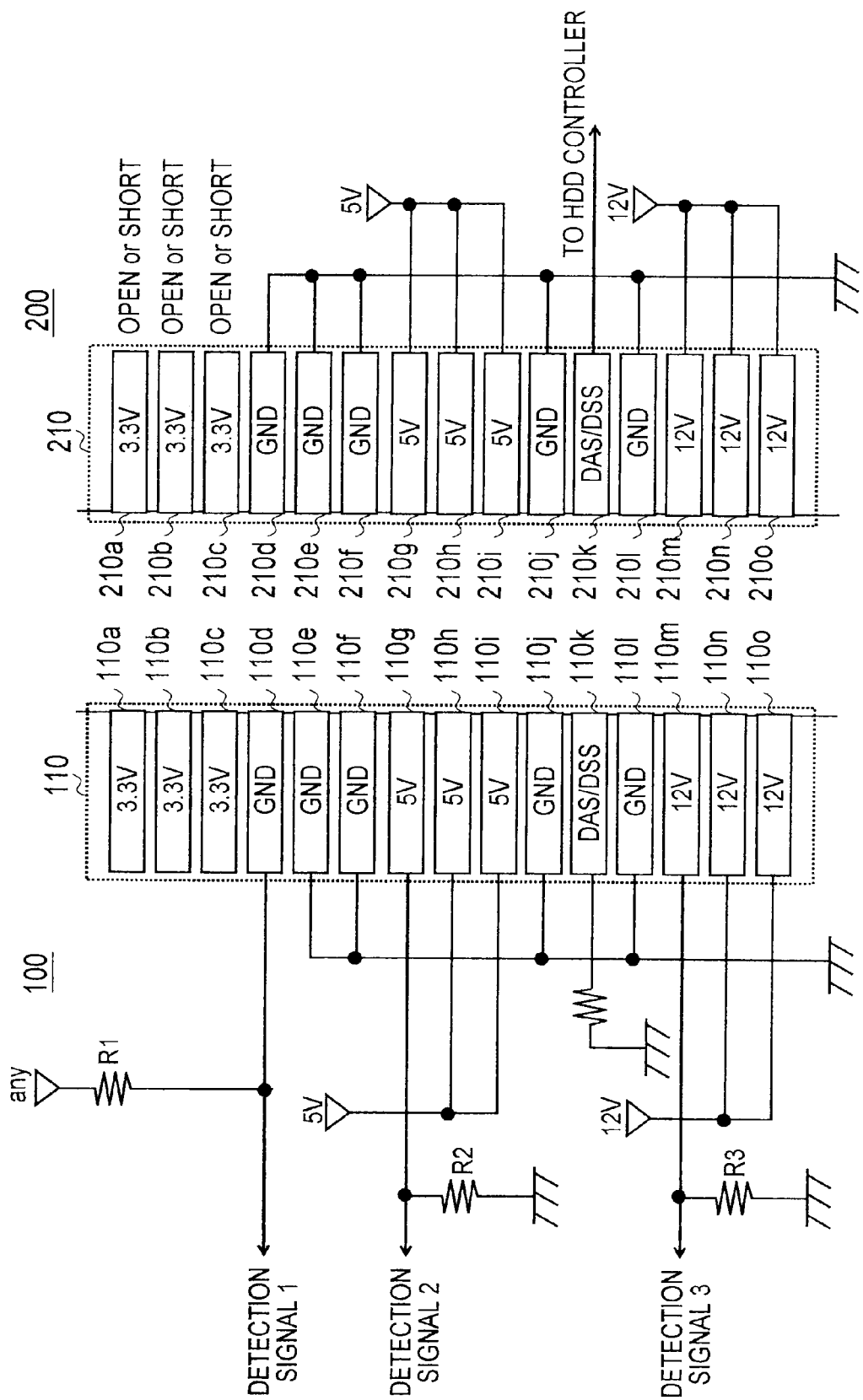
FIG. 4 is a diagram showing a detailed configuration of a SATA power connector on the main body, and another SATA power connector on the HDD according to the embodiment of the present invention.

Next, in reference to FIGS. 3 and 4, the detailed configuration of a NAS according to the present embodiment is described. However, description of configurations not related to the present invention is omitted.

FIG. 3 is a block diagram showing the configuration of a NAS according to the present embodiment.

As shown in FIG. 3, the cartridge type HDD 200 has a HDD controller 240 and a HDD 250 in addition to the HDD SATA power connector 210 and the HDD SATA signal connector 220. The HDD controller 240 mainly controls writing to the HDD 250 and reading from the HDD 250. The HDD 250 includes a magnetic disc and a motor which drives the magnetic disc.

The HDD controller 240 and the HDD 250 are supplied with power from the main body SATA power connector 110 of the storage device main body 100 via the HDD SATA power connector 210. According to the SATA standard, three types of power supply voltages 12V, 5V, and 3.3V can be supplied, but, in the present embodiment, 12V and 5V are supplied.

The storage device main body 100 includes a SATA controller 140, a CPU 150, a memory 160, a network interface 170, and an LED 180 in addition to the main body SATA power connector 110 and the main body SATA signal connector 120.

The SATA controller 140 transmits and receives a SATA signal via the main body SATA signal connector 120. The memory 160 is, for example, a nonvolatile semiconductor memory, and the CPU 150 controls the entire storage device main body 100 by executing programs stored in the memory 160.

The CPU 150 serves as a connection detector that detects the electrical connection of the HDD connector 230 to the main body connector 130. The details of the operations for detecting the electrical connection are described later.

Also, the SATA controller 140 and the CPU 150 serve as an operation confirmation unit for confirming that the cartridge type HDD 200 operates normally when the CPU 150 detects the electrical connection of the HDD connector 230 to the main body connector 130.

In concrete terms, the CPU 150, after detecting the electrical connection, causes the SATA controller 140 to transmit a predetermined command to the cartridge type HDD 200. In the case where a response to the command cannot be received from the cartridge type HDD 200, it can be determined that the cartridge type HDD 200 is not operating normally. On the other hand, in the case where a response to the command can be received from the cartridge type HDD 200, it can be determined that the cartridge type HDD 200 is operating normally. Instead of such a command, a signal belonging to the physical layer (for example, a signal corresponding to the Link Pulse of Ethernet (registered trademark)) may be used for confirming the electrical connection.

The network interface 170 is connected to the network 300, and inputs and outputs a command or data. The CPU 150, when detecting the electrical connection of the HDD connector 230 to the main body connector 130, transmits the information indicating the connection from the network interface 170 to the client terminal 400. Alternatively, if the CPU 150, after detecting the electrical connection of the HDD connector 230 to the main body connector 130, determines that the cartridge type HDD 200 is not operating normally, the CPU 150 transmits the information indicating the determined result from the network interface 170 to the client terminal 400. The client terminal 400, when receiving the information, displays a message on the screen (for example, Web screen), the message showing that the HDD connector 230 has been electrically connected to the main body connector 130 or that the cartridge type HDD 200 is not operating normally.

The LED 180 emits light in response to a signal from the CPU 150. The CPU 150, when detecting that the HDD connector 230 has been electrically connected to the main body connector 130, transmits a signal to the LED 180 to make the LED 180 emit light. Alternatively, if the LED 180, after detecting the connection of the HDD connector 230 to the main body connector 130, determines that the cartridge type HDD 200 is not operating normally, the CPU 150 transmits a signal to the LED 180 to make the LED 180 emit light. The NAS may have a configuration in which an LED for connector connection notification and another LED for abnormal state notification are separately provided.

In this manner, in the present embodiment, the CPU 150, the network interface 170, and the LED 180 constitute a notification unit that performs notification to a user based on whether the electrical connection of the HDD connector 230 is detected.

FIG. 4 is a diagram showing a detailed configuration of the main body SATA power connector 110 and the HDD SATA power connector 210.

As shown in FIG. 4, the main body SATA power connector 110 has pins 110a to 110o, and the HDD SATA power connector 210 has pins 210a to 210o. Pin arrangements of each of the main body SATA power connector 110 and the HDD SATA power connector 210 comply with the SATA standard.

Most of the pins 110a to 110o and 210a to 210o are power supply pins used for electric current supply and ground pins used for grounding. To be concrete, the pins 110a to 110c and 210a to 210c are power supply pins kept at a voltage of 3.3V. The pins 110d to 110f, 110j, 110l, 210d to 210f, 210j, and 210l are ground pins. The pins 110k and 210k are Device Activity Signal/Disable Staggered Spinup (DAS/DSS) pins. The pins 110m to 110o and 210m to 210o are power supply pins kept at a voltage of 12V.

The power supply pins and ground pins of the HDD SATA power connector 210, i.e. the pins 210a to 210j and 210l to 210o, serve as multiple short-circuit pins that are internally shorted (connected to each other).

The power supply pins and ground pins of the main body SATA power connector 110, i.e. the pins 110a to 110j and 110l to 110o, serve as multiple opposite pins provided in respectively opposite positions relative to the multiple short-circuit pins.

The CPU 150 (connection detector) is connected to the specific pins 110d, 110g, 110m among the power supply pins and the ground pins of the main body SATA power connector 110, with a pull-up resistor R1, and pull-down resistors R2 and R3 connected thereto, respectively. To be concrete, the CPU 150 detects the electrical connection of the HDD connector 230 to the main body connector 130 based on the voltages at or the currents through, the pins 110d, 110g, and 110m.

In the present embodiment, the CPU 150 detects the electrical connection of the HDD connector 230 to the main body connector 130 based on the voltage levels at the pins 110d, 110g, 110m. In the following, the voltage level at each of the pins 110d, 110g, and 110m is called a detection signal.

(3) Connection Detection Operations

Next, in reference to FIGS. 4 and 5, connection detection operations by the CPU 150 are described. FIG. 5 is a table used for describing the connection detection operations by the CPU 150.

The ground pin 110d shown in FIG. 4 is connected to one end of the pull-up resistor R1, and a non-zero voltage supply is connected to the other end of the pull-up resistor R1. The ground pin 210d is grounded.

Before the HDD connector 230 is electrically connected to the main body connector 130, detection signal 1 (voltage level of the ground pin 110d) is at a non-zero voltage as shown in FIG. 5. When the HDD connector 230 is electrically connected to the main body connector 130 and the ground pin 110d is in contact with the ground pin 210d, the detection signal 1 is set at the ground level (0V) as shown in FIG. 5. The detection signal 1 is inputted to the CPU 150, and thus the CPU 150 can detect the electrical connection of the HDD connector 230 on the basis of the detection signal 1.

Also, the power supply pin 110g at 5V shown in FIG. 4 is connected to one end of the pull-down resistor R2, and the other end of the pull-down resistor R2 is grounded. The 5V power supply pin 210g is maintained at 5V.

Before the HDD connector 230 is electrically connected to the main body connector 130, a detection signal 2 (voltage level of the power supply pin 110g) is at zero volt as shown in FIG. 5. When the HDD connector 230 is electrically connected to the main body connector 130 and the power supply pin 110g is in contact with the power supply pin 210g, the detection signal 2 is set at 5V as shown in FIG. 5. The detection signal 2 is inputted to the CPU 150, and thus the CPU 150 can detect the electrical connection of the HDD connector 230 on the basis of the detection signal 2.

Further, the power supply pin 110m at 12V shown in FIG. 4 is connected to one end of the pull-down resistor R3, and the other end of the pull-down resistor R3 is grounded. The 12V power supply pin 210m is maintained at 12V.

Before the HDD connector 230 is electrically connected to the main body connector 130, a detection signal 3 (voltage level of the power supply pin 110m) is at zero volt as shown in FIG. 5. When the HDD connector 230 is electrically connected to the main body connector 130 and the power supply pin 110m is in contact with the power supply pin 210m, the detection signal 3 is set at 12V as shown in FIG. 5. The detection signal 3 is inputted to the CPU 150, and thus the CPU 150 can detect the electrical connection of the HDD connector 230 on the basis of the detection signal 3.

In this manner, according to the present embodiment the electrical connection of the HDD connector 230 can be detected by using any one of the detection signals 1 to 3. Alternatively, the CPU 150 may detect the electrical connection of the HDD connector 230 based on the combination of the detection signals 1 to 3.

For example, if all (or any two) of the detection signals 1 to 3 indicate "connected", the CPU 150 may determine that the HDD connector 230 is electrically connected, or otherwise the CPU 150 may determine that the HDD connector 230 is not electrically connected. Hence, accuracy in detecting the electrical connection can be increased.

(4) Effects of the Embodiment

As described above, in the present embodiment, some of the internally shorted pins (power supply pins or ground pins), i.e. the pins 210a to 210j and 210l to 210o, of the HDD connector 230 configured to comply with the SATA standard are used to confirm the electrical connection of the HDD connector 230. Accordingly, dedicated pins for electrical connection confirmation need not be newly added to the connector, and thus the electrical connection between the connectors can be confirmed while the compatibility of the connectors is maintained and the connector size can remain small.

Further, in the present embodiment, the CPU 150 of the storage device main body 100 can recognize one of the following statuses a) to c): a) not connected at all, b) connected but not operating normally (e.g. the connector is broken), and c) normally connected and operable.

Also, by causing the CPU 150, the network interface 170, and the LED 180 to perform the process of notification to a user based on whether the electrical connection of the HDD connector 230 has been detected, the user can confirm a connection status between the connectors.

Furthermore, by causing the CPU 150 to detect whether the HDD connector 230 is electrically connected based on a combination of the detection signals 1 to 3, accuracy in detecting electrical connection can be increased.

(5) Other Embodiments

Although the invention has been disclosed through the embodiment according to the present invention as described above, it should be understood that the discussion and drawings which form a part of the disclosure are not intended to limit the invention. Various alternative embodiments, implementation examples, and application techniques will be apparent to those skilled in the art.

In the above mentioned embodiment, an example of performing notification to a user using the LED 180 is described, but the NAS may have a configuration in which a loudspeaker for emitting buzzer sound is used instead of the LED 180.

In the above mentioned embodiment, a configuration complying with the SATA standard which is one of the interface standards has been described, but the present invention is not limited to the SATA standard and other interface standard may be applied. For example, an interface standard such as the ATA standard, the RS-232C standard, the Centronics standard, the small computer system interface (SCSI) standard, the serial attached SCSI (SAS) standard, or the universal serial bus (USB) may be applied to the present invention.

The above mentioned embodiment has been described in the case where the connection confirmation system of the present invention is applied to the NAS, but the connection confirmation system of the present invention may be applied to an IP-STB (Set Top Box) or a broadband router. In the case where the connection confirmation system of the present invention is applied to an IP-STB, STB main body corresponds to the main body device, and a storage medium inserted in the STB main body corresponds to the external device. Also, in the case where the connection confirmation system of the present invention is applied to a broadband router, main body router corresponds to the main body device, and a storage medium inserted in the main body router corresponds to the external device.

Furthermore, the external device according to the present invention is not limited to the storage medium, but a card reader, a tuner, or a radio I/F (Bluetooth, RFID, etc.) can also be used as the external device according to the present invention.

In the above mentioned embodiment, the configuration for performing electrical connection confirmation using the power pins and ground pins has been described. However, in the case where multiple signal pins are internally shorted, a configuration for performing electrical connection confirmation using signal pins may also be implemented.

In this manner, the present invention naturally includes various embodiments not specifically described herein. Accordingly, the technical scope of the present invention should be defined only by the attached claims which are to be interpreted on the basis of the above description.

What is claimed is:

1. An electrical connection confirmation system comprising:
   an external device; and
   a main body device into which the external device is inserted, wherein
   the external device includes an external device connector configured to comply with a predetermined interface standard, the external device connector having a plurality of short-circuit pins that are internally shorted, and
   the main body device includes:
      a main body device connector configured to comply with the predetermined interface standard, the main body device connector having a plurality of opposite pins provided in positions respectively opposite to the plural short-circuit pins; and
      a connection detector connected to a specific one of the plural opposite pins, and configured to detect the electrical connection of the external device connector to the main body device connector on the basis of the state of a voltage at or an electric current through the specific opposite pin.

2. The electrical connection confirmation system according to claim 1, wherein
   each of the plural short-circuit pins and the plural opposite pins is any one of a power supply pin used for power supply, a ground pin used for grounding, and a signal pin used for signal input/output.

3. The electrical connection confirmation system according to claim 1, wherein
   at least two of the plural opposite pins serve as the specific opposite pin, and
   the connection detector detects the electrical connection of the external device connector to the main body device connector based on a combination of voltage states or electric current states of the specific opposite pins.

4. The electrical connection confirmation system according to claim 1, wherein
   the main body device includes a notification unit that performs notification to a user based on whether the electrical connection of the external device connector is detected by the connection detector.

5. The electrical connection confirmation system according to claim 1, wherein
   the predetermined interface standard is Serial Advanced Technology Attachment (SATA) standard.

6. The electrical connection confirmation system according to claim 1, wherein
   the external device is a removable storage medium, and
   the main body device is a storage device main body that writes data to the storage medium and reads data from the storage medium.

7. The electrical connection confirmation system according to claim 1, wherein
   the main body device includes an operation confirmation unit configured to confirm whether the external device operates normally or not, when the connection detector detects the electrical connection of the external device connector to the main body device connector.

8. A main body device into which an external device is inserted, the external device including an external device connector configured to comply with a predetermined interface standard, the external device connector having a plurality of short-circuit pins that are internally shorted, the main body device comprising:
   a main body device connector configured to comply with the predetermined interface standard, the main body device connector having a plurality of opposite pins provided in positions respectively opposite to the plural short-circuit pins; and
   a connection detector connected to a specific one of the plural opposite pins, and configured to detect the electrical connection of the external device connector to the main body device connector based on a voltage state or an electric current state of the specific opposite pin.

9. The main body device according to claim 8, wherein
   each of the plural short-circuit pins and the plural opposite pins is any one of a power supply pin used for power supply, a ground pin used for grounding, and a signal pin used for signal input/output.

10. The main body device according to claim 8, wherein
    at least two of the plurality of opposite pins serve as the specific pin, and
    the connection detector detects the electrical connection of the external device connector to the main body device connector based on a combination of voltage states or electric current states of specific opposite pins.

11. The main body device according to claim 8, wherein
    the main body device includes a notification unit that performs notification to a user based on whether the electrical connection of the external device connector is detected by the connection detector.

12. The main body device according to claim 8, wherein
    the predetermined interface standard is Serial Advanced Technology Attachment (SATA) standard.

13. The main body device according to claim 8, wherein
    the external device is a removable storage medium, and
    the main body device is a storage device main body that writes data to the storage medium and reads data from the storage medium.

* * * * *